US009450550B2

(12) United States Patent
Aleman et al.

(10) Patent No.: US 9,450,550 B2
(45) Date of Patent: Sep. 20, 2016

(54) NANOSCALE ELECTROMECHANICAL PARAMETRIC AMPLIFIER

(71) Applicants: Benjamin Jose Aleman, Berkeley, CA (US); Alexander Zettl, Kensington, CA (US)

(72) Inventors: Benjamin Jose Aleman, Berkeley, CA (US); Alexander Zettl, Kensington, CA (US)

(73) Assignee: The Regents of the University of California, Oakland, CA (US)

( * ) Notice: Subject to any disclaimer, the term of this patent is extended or adjusted under 35 U.S.C. 154(b) by 461 days.

(21) Appl. No.: 13/946,908

(22) Filed: Jul. 19, 2013

(65) Prior Publication Data

US 2014/0266421 A1    Sep. 18, 2014

Related U.S. Application Data

(60) Provisional application No. 61/674,071, filed on Jul. 20, 2012.

(51) Int. Cl.
*H03F 7/00* (2006.01)
*H03F 7/04* (2006.01)

(52) U.S. Cl.
CPC . *H03F 7/00* (2013.01); *H03F 7/04* (2013.01)

(58) Field of Classification Search
CPC .............. H03F 7/00; H03F 7/02; H03F 7/04
USPC .......................... 330/4.5; 977/939, 950, 724
See application file for complete search history.

(56) References Cited

U.S. PATENT DOCUMENTS

2010/0271003 A1   10/2010   Jensen

OTHER PUBLICATIONS

Aleman, B.J., Sussman, A., Mickelson, W., Zettl, A. "A Carbon Nanotube-based NEMS Parametric Amplifier for Enhanced Radio Wave Detection and Electronic Signal Amplification," Journal of Physics, Conference Series 302 (2011).
Caves C 1982 Phys. Rev. D 26 1817.
Rugar D and Grütter p. 1991 Phys. Rev. Lett. 67 699-702.
Collins P and Zettl A 1996 Appl. Phys. Lett. 69 1969.
Collins P and Zettl A 1997 Phys. Rev. B 55 9391.
de Heer W, Chatelain A and Ugarte D 1995 Science 270 1179-1180.
Fowler R and Nordheim L 1928 Proc. R. Soc. London, Ser. A 119 173-181.
Poncharal P, Wang Z, Ugarte D and de Heer W 1999 Science 283 1513-1516.
Jensen K, Weldon J, Garcia H and Zettl a 2007 Nano Letters 7(11) 3508-3511.
Jensen K, Kim K and Zettl A 2008 Nature Nanotech. 3(9) 533-537.
Weldon J, Alemán B, Sussman A, Gannett W and Zettl A 2010 Nano Lett. 10 1728-1733.
Hatridge M, Vijay R, Slichter D, Clarke J and Siddiqi 12011 Phys. Rev. B 83 134501.

*Primary Examiner* — Benny Lee
(74) *Attorney, Agent, or Firm* — Lawrence Berkeley National Laboratory

(57) ABSTRACT

This disclosure provides systems, methods, and apparatus related to a parametric amplifier. In one aspect, a device includes an electron source electrode, a counter electrode, and a pumping electrode. The electron source electrode may include a conductive base and a flexible conductor. The flexible conductor may have a first end and a second end, with the second end of the flexible conductor being coupled to the conductive base. A cross-sectional dimension of the flexible conductor may be less than about 100 nanometers. The counter electrode may be disposed proximate the first end of the flexible conductor and spaced a first distance from the first end of the flexible conductor. The pumping electrode may be disposed proximate a length of the flexible conductor and spaced a second distance from the flexible conductor.

19 Claims, 5 Drawing Sheets

NANOSCALE ELECTROMECHANICAL PARAMETRIC AMPLIFIER

CROSS REFERENCE TO RELATED APPLICATIONS

This application claims priority to U.S. Provisional Patent Application No. 61/674,071, filed Jul. 20, 2012, which is herein incorporated by reference. This application is related to U.S. patent application Ser. No. 12/681,760, filed Jul. 13, 2010, which is herein incorporated by reference.

STATEMENT OF GOVERNMENTAL SUPPORT

This invention was made with government support under Contract No. DE-AC02-05CH11231 awarded by the U.S. Department of Energy. The government has certain rights in this invention.

FIELD

Embodiments disclosed herein relate generally to nanoscale electromechanical systems (NEMS) devices, and more particularly to NEMS parametric amplifiers.

BACKGROUND

The phenomenon of parametric amplification, such as occurs in a child's swing, has been studied since the early 19$^{th}$ century and occurs in oscillating systems in which a parameter (e.g., resonance frequency, spring constant, degree of dissipation, etc.) is modulated at a sub-multiple of twice the resonance frequency, $2\omega_0/n$, to produce amplification in the response of the system. Parametric amplifiers have generated sustained interest because their operational noise can approach the quantum-limit and several implementations of this phenomenon have been demonstrated in electronic systems using varactors and Josephson junctions, optical systems using nonlinear materials, and in electromechanical systems.

SUMMARY OF THE INVENTION

Described herein is a device which may be used as a nanoscale electromechanical parametric amplifier. In some embodiments, a device may include a nanostructure resonator for parametric amplification of mechanical oscillations. By operating the device in the limit of strong coupling between mechanical vibrations and field emission tunnelling current, the device may behave as a tuneable, high-gain, phase-sensitive amplifier of alternating current (AC) current or AC voltage signals. Additionally, the same device may be used as a tuneable, highly-sensitive detector of radio frequency (RF) electromagnetic radiation or as an RF transmitter.

One innovative aspect of the subject matter described in this disclosure can be implemented in a device including an electron source electrode, a counter electrode, and a pumping electrode. The electron source electrode includes a conductive base and a flexible conductor, the flexible conductor having a first end and a second end, with the second end of the flexible conductor being coupled to the conductive base. A cross-sectional dimension (e.g., such as a diameter, etc.) of the flexible conductor is less than about 100 nanometers. The counter electrode is disposed proximate the first end of the flexible conductor and spaced a first distance from the first end of the flexible conductor. The pumping electrode is disposed proximate a length of the flexible conductor and spaced a second distance from the flexible conductor.

In some embodiments, the device further comprises an AC power supply and a DC power supply. The AC power supply and the DC power supply are electrically connected in series to the pumping electrode. In some embodiments, the DC power supply comprises a battery.

In some embodiments, the second distance is specified so that the flexible conductor is not in contact with the pumping electrode when vibration of the flexible conductor is at a maximum vibrational amplitude.

In some embodiments, the flexible conductor is selected from a group consisting of a single-wall nanotube, a multi-wall nanotube, and a nanowire. In some embodiments, the flexible conductor comprises a single-wall carbon nanotube or a multi-wall carbon nanotube. In some embodiments, the flexible conductor comprises a single-wall boron-carbon-nitrogen nanotube or a multi-wall boron-carbon-nitrogen nanotube. In some embodiments, the flexible conductor comprises a semiconducting nanowire or a metal nanowire.

In some embodiments, the conductive base comprises a metal selected from a group consisting of copper, aluminum, gold, silver, platinum, titanium, palladium, and chromium. In some embodiments, the counter electrode comprises a metal selected from a group consisting of copper, aluminum, gold, silver, platinum, titanium, palladium, and chromium. In some embodiments, the pumping electrode comprises a metal selected from a group consisting of copper, aluminum, gold, silver, platinum, titanium, palladium, and chromium. In some embodiments, the pumping electrode comprises a doped semiconductor.

In some embodiments, the flexible conductor is about 0.5 microns to 10 microns long. In some embodiments, the flexible conductor has a cross-sectional dimension of about 2 nanometers to 50 nanometers. In some embodiments, the first distance is about 1 nanometer to 1 millimeter. In some embodiments, the second distance is about 0.1 to 10 times a length of the flexible conductor.

In some embodiments, the electron source electrode and the counter electrode are disposed in a first plane. In some embodiments, the pumping electrode is disposed in the first plane.

In some embodiments, the device is configured to have a direct current voltage applied between the electron source electrode and the counter electrode, to have an alternating current voltage applied to the pumping electrode that causes the flexible conductor to oscillate, and to receive an alternating current at the counter electrode due to field emission of electrons from the flexible conductor to the counter electrode. In some embodiments, the device is further configured to amplify the alternating current voltage applied to the pumping electrode. In some embodiments, the device is further configured to have a direct current offset voltage applied between the electron source electrode and the pumping electrode.

Another innovative aspect of the subject matter described in this disclosure can be implemented a method including providing a device comprising an electron source electrode, a counter electrode, and a pumping electrode. The electron source electrode includes a conductive base and a flexible conductor, the flexible conductor having a first end and a second end, with the second end of the flexible conductor being coupled to the conductive base. A cross-sectional dimension (e.g., such as a diameter, etc.) of the flexible conductor is less than about 100 nanometers. The counter electrode is disposed proximate the first end of the flexible conductor and spaced a first distance from the first end of the flexible conductor. The pumping electrode is disposed proximate a length of the flexible conductor and spaced a second distance from the flexible conductor. The method further comprises applying a direct current voltage between the electron source electrode and the counter electrode, applying an alternating current voltage to the pumping electrode that causes the flexible conductor to oscillate, and receiving an alternating current at the counter electrode due to field emission of electrons from the flexible conductor to the counter electrode.

In some embodiments, the alternating current voltage applied to the pumping electrode is amplified. In some embodiments, the method further comprises applying a direct current offset voltage between the electron source electrode and the pumping electrode.

Details of one or more embodiments of the subject matter described in this specification are set forth in the accompanying drawings and the description below. Other features, aspects, and advantages will become apparent from the description, the drawings, and the claims. Note that the relative dimensions of the following figures may not be drawn to scale.

DETAILED DESCRIPTION OF THE INVENTION

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise.

INTRODUCTION

Suspended carbon nanotube field emitters have been explored as electron sources and Fowler-Nordheim diodes, and have shown promise as resonators in nanoelectromechanical systems (NEMS) with applications to radio wave detection, atomic-resolution inertial mass sensing, and self-sustained RF oscillators. Apart from being able to actuate carbon nanotube field-emission devices with electromagnetic fields, they offer a unique way to read out vibrational information because the field-emission current is strongly coupled to the position of the nanotube relative to the counter electrode. This coupling occurs because the field emission current is dominated by the local field at the nanotube tip which can vary substantially as the nanotube position changes relative to a counter electrode. Therefore, the vibrational dynamics of the nanotube can be ascertained from a direct monitoring of the field emission current.

Modern communications and computation systems rely increasingly on miniaturized high speed and low noise electronic devices and optical devices. Nanoscale electromechanical parametric amplifiers, as disclosed herein, present new opportunities for robust and compact amplification devices that can operate at low noise levels, at low power levels, and at tuneable RF and microwave frequencies. Conventional semiconductor-based electronics often suffer from thermally-activated atomic diffusion, high leakage currents (leading to unacceptable power dissipation), and high noise.

Device and Methods

Figure 1A:
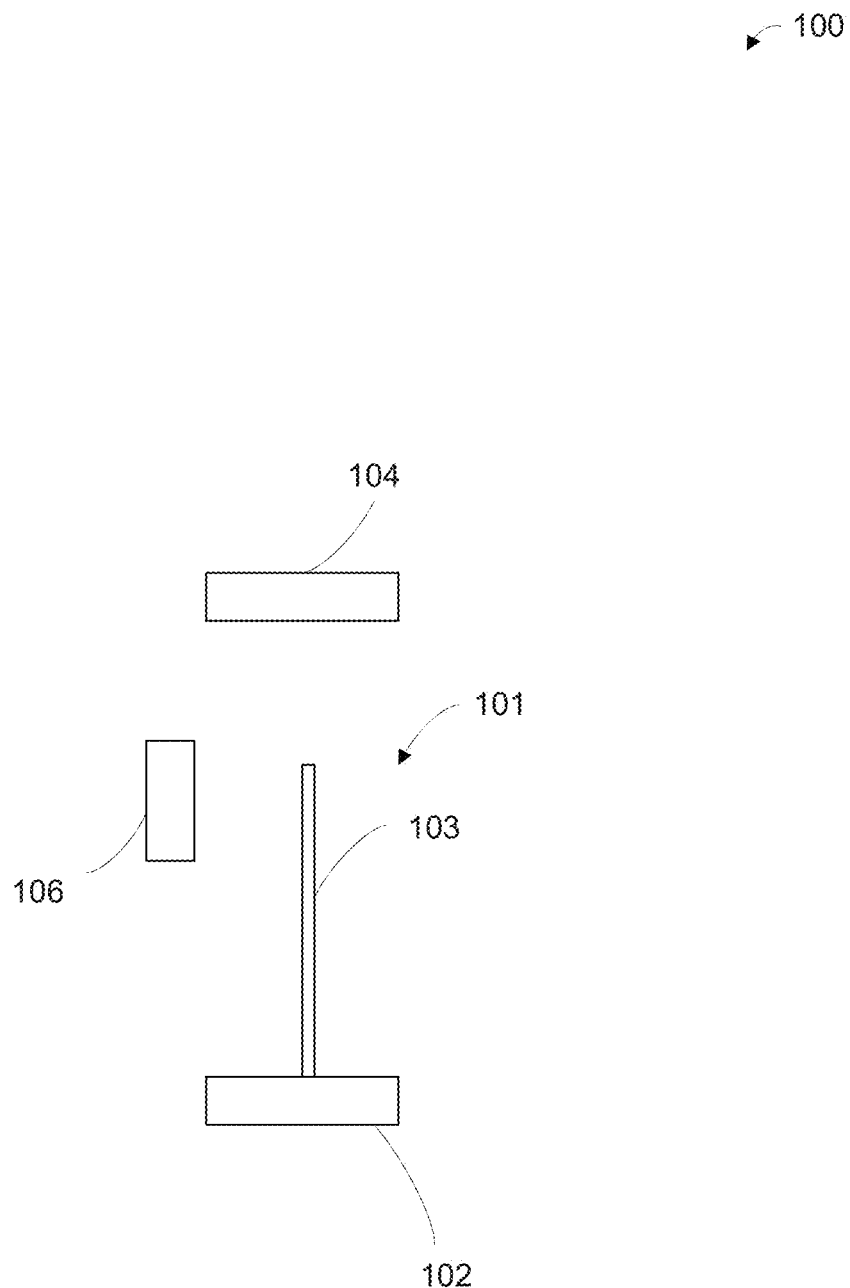
FIG. 1A shows an example of a schematic illustration of a nanoscale electromechanical parametric amplifier.

FIG. 1A shows an example of a schematic illustration of a nanoscale electromechanical parametric amplifier. As shown in FIG. 1A, a nanoscale electromechanical parametric amplifier 100 includes an electron source electrode 101, a counter electrode 104, and a pumping electrode 106. In some embodiments, the electron source electrode 101 includes a flexible conductor 103 coupled to a conductive base 102. In some embodiments, a cross-sectional dimension (e.g., such as a diameter, etc.) of the flexible conductor 103 is less than about 100 nanometers.

In some embodiments, the flexible conductor 103 comprises a nanostructure having an aspect ratio greater than about 10 to 1, with the nanostructure being flexible (i.e., able to elastically bend) and electrically conductive. In some embodiments, the flexible conductor 103 comprises a single-wall nanotube, a multi-wall nanotube, a nanowire, or a nanoscale beam. In some embodiments, the flexible conductor 103 comprises a single-wall carbon nanotube, a single-wall boron (i.e., B)-carbon (i.e., C)-nitrogen (i.e., N) nanotube (BCN), a multi-wall carbon nanotube, or a multi-wall boron-carbon-nitrogen nanotube. In some embodiments, the flexible conductor 103 comprises a semiconducting nanowire (e.g., silicon, indium phosphide, or gallium nitride) or a metal nanowire (e.g., nickel, platinum, or gold). In some embodiments, the flexible conductor 103 comprises a silicon nanoscale beam or a silicon carbide nanoscale beam, and may include a conducting metallic layer deposited on surfaces of the beam. In some embodiments, the flexible conductor 103 has a cross-section that is round, oval, rectangular, square, triangular, or a polygonal.

In some embodiments, the flexible conductor 103 may be about 0.5 microns to 10 microns long, 0.5 microns to 1.5 microns long, or about 1 micron long. In some embodiments, the flexible conductor may have a cross-sectional dimension (e.g., a diameter) of about 2 nanometers (nm) to 50 nm, about 2 nm to 8 nm, or about 5 nm.

In some embodiments, the conductive base 102 comprises a metal. In some embodiments, the conductive base 102 comprises copper, aluminum, gold, silver, platinum, titanium, palladium, or chromium. In some embodiments, an end of the flexible conductor 103 may be embedded in or attached to the conductive base 102.

In some embodiments, the counter electrode 104 is disposed opposite an end of the flexible conductor 103 and spaced a distance from the end of the flexible conductor 103. For example, in some embodiments, the distance separating the end of the flexible conductor 103 and the counter electrode 104 is about 1 nm to 1 millimeter (mm), about 1 nm to 10 microns, about 1 micron to 100 microns, or about 1 micron to 1 mm. In some embodiments, the counter electrode 104 comprises a metal. In some embodiments, the counter electrode comprises copper, aluminum, gold, silver, platinum, titanium, palladium, or chromium. In some embodiments, the counter electrode 104 and the electron source electrode 101 are contained in the same plane.

In some embodiments, the pumping electrode 106 is disposed proximate a length of the flexible conductor 103. In some embodiments, the pumping electrode 106 is spaced a distance from the flexible conductor 103 so that the flexible conductor 103 does not contact the pumping electrode 106 when vibration of the flexible conductor 103 is at a maximum vibrational amplitude. For example, in some embodiments, the pumping electrode 106 is positioned about 0.1 to 10 times a length of the flexible conductor 103 from the flexible conductor 103, or about 50 nanometers to 100 microns, when the flexible conductor 103 is not resonating or vibrating (i.e., when the flexible conductor is at its equilibrium or resting position). In some embodiments, the length of the flexible conductor 103 may be taken as the length of the flexible conductor 103 as measured from a surface of the conductive base 102 to which the flexible conductor 103 is coupled.

In some embodiments, the pumping electrode 106 is configured to generate parametric modulation of the flexible conductor 103. In some embodiments, the pumping electrode 106 comprises a metal. In some embodiments, the pumping electrode 106 comprises copper, aluminum, gold, silver, platinum, titanium, palladium, or chromium. In some embodiments, the pumping electrode 106 comprises a doped semiconductor, such as doped silicon, for example.

Figure 1B:
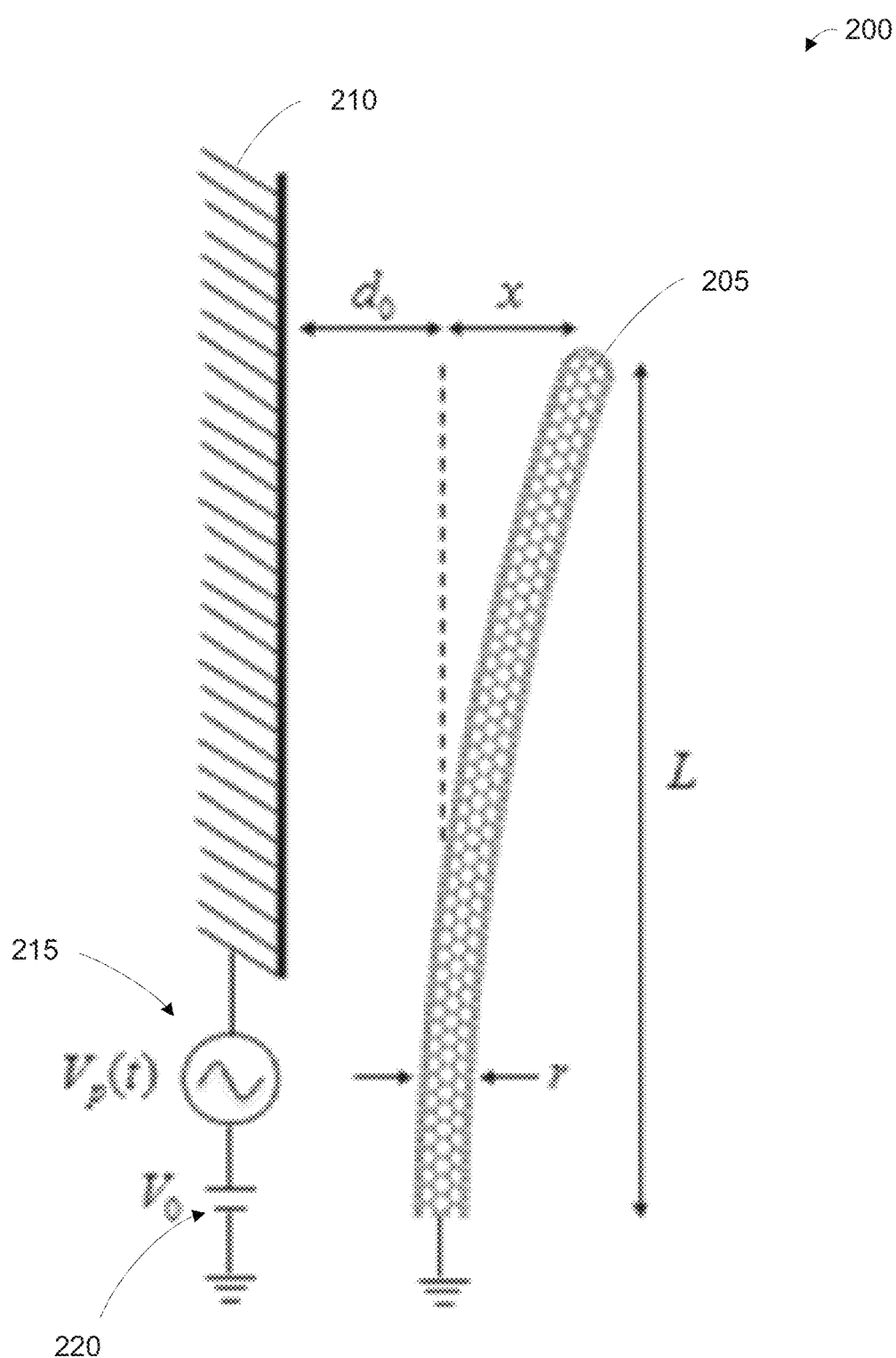
FIG. 1B shows an example of a schematic illustration of portions of a nanoscale electromechanical parametric amplifier.
Figure 2:
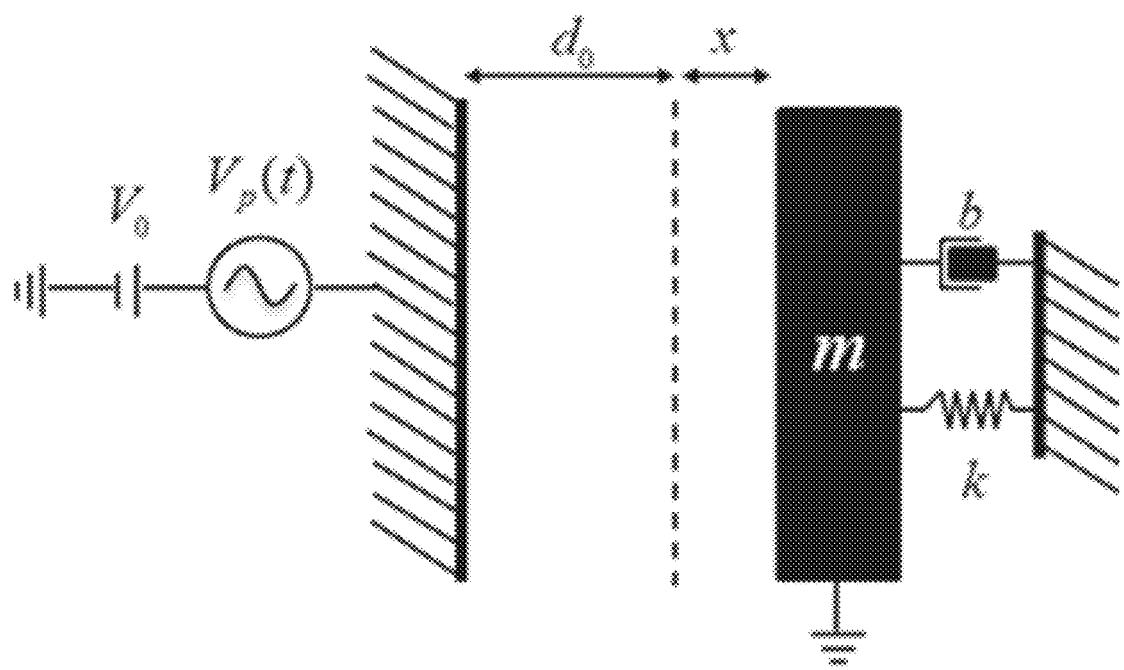
FIG. 2 shows an example of a schematic illustration of the equivalent electromechanical representation for the pumping electrode-flexible conductor interaction shown in FIG. 1B.

FIG. 1B shows an example of a schematic illustration of portions of a nanoscale electromechanical parametric amplifier. A nanoscale electromechanical parametric amplifier 200 includes a flexible conductor 205 that is part of an electron source electrode, a counter electrode (not shown), and a pumping electrode 210. Also shown in FIG. 1B as part of the amplifier 200 are the basic electronic components associated with the amplifier, including a power supply 215 and a power supply 220. The power supply 215 is configured to apply an AC voltage $V_p(t)$ to the pumping electrode 210. The power supply 220 is configured to apply a DC voltage $V_0$ (e.g., a DC offset voltage) to the pumping electrode 210. Applying an AC voltage and a DC voltage to the pumping electrode 210 may cause the flexible conductor 205 to oscillate or vibrate. A distance $d_0$ in FIG. 1B and FIG. 2 represents the equilibrium (i.e., not vibrating) distance of the flexible conductor 205 from the pumping electrode 210, and a distance x represents the maximum amplitude of the vibration of the flexible conductor 205. In some embodiments, parametric amplification can be achieved using a single suspended carbon nanotube field emitter as the flexible conductor 205 that can operate as a current or voltage amplifier or as an electromagnetic wave transducer, with a direct field emission current output signal.

FIG. 2 shows an example of a schematic illustration of the equivalent electromechanical representation for the pumping electrode-flexible conductor interaction shown in FIG. 1B. The pumping electrode-flexible conductor interaction is modeled as a position variable capacitor of mass m connected to a rigid support by a spring of spring constant k and dissipation b. $V_p(t)$ is the AC voltage applied to the pumping electrode. $V_0$ is the DC offset voltage applied to the pumping electrode.

Scalable methods, as known by a person of ordinary skill in the art, can be used to fabricate a nanoscale electromechanical parametric amplifier with specific performance characteristics. For example, standard optical and electron-beam lithography, micro-fabrication processing, and simple nanostructure fabrication techniques (e.g., spin casting) can used to produce an amplifier with defined dimensions L, $d_0$, and r, as shown in FIG. 1B.

For example, to fabricate a carbon nanotube nanoscale electromechanical parametric amplifier, carbon nanotubes may first be fabricated. A single nanotube may then be isolated, and the electron source electrode and counter electrode may be fabricated around the nanotube. The counter electrode may be positioned a short distance from the end of the carbon nanotube, with the pumping electrode, which may be fabricated in a similar fashion, spaced a distance greater than x (as shown in FIG. 1B) from the nanotube, such that the nanotube at maximum vibrational amplitude will not make contact with the pumping electrode.

In some embodiments, the fabrication processes may be performed on a thin membrane that can be etched after completing the fabrication processes to produce the suspended structure (i.e., the flexible conductor). In some embodiments, the membrane may be a silicon nitride ($Si_3N_4$) membrane. In some embodiments, fabrication techniques that do not use a membrane may be used. For example, some fabrication process may suspend nanotubes over trenches and may exploit techniques for the controlled placement of highly aligned single-wall carbon nanotubes (SWNT) or multi-wall carbon nanotubes (MWCNT).

Figure 3:
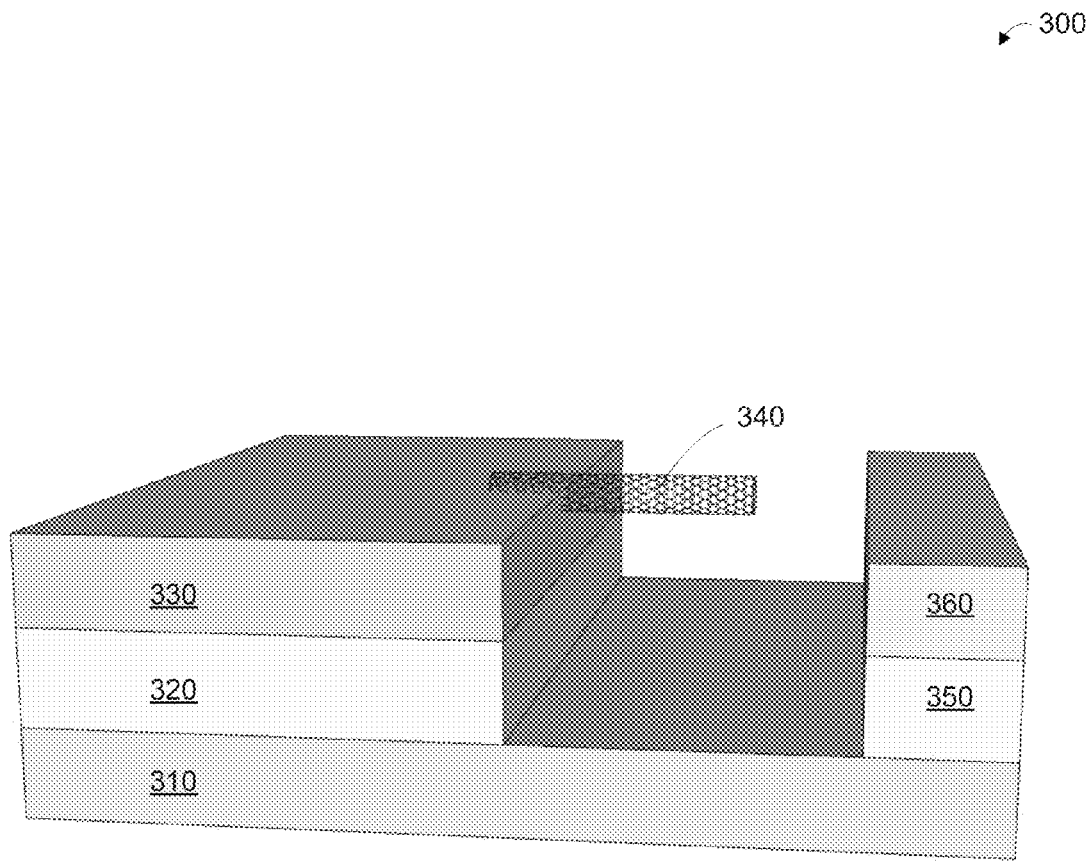
FIG. 3 shows an example of an isometric illustration of a nanoscale electromechanical parametric amplifier.

FIG. 3 shows an example of an isometric illustration of a nanoscale electromechanical parametric amplifier. As shown in FIG. 3, a nanoscale electromechanical parametric amplifier 300 includes a substrate 310, an insulating layer 320 disposed on the substrate 310, and a metal contact layer 330 disposed on the insulating layer 320. A flexible conductor 340 is coupled to the metal contact layer 330. The nanoscale electromechanical parametric amplifier 300 further includes an insulating layer 350 disposed on the substrate 310 and a metal counter electrode layer 360 disposed on the insulating layer 350. The insulating layer 350 and the metal counter electrode layer 360 are positioned on the substrate 310 such that an open space or region is defined between the flexible conductor 340 and the metal counter electrode 360. In some embodiments, the nanoscale electromechanical parametric amplifier 300 may be similar to the nanoscale electromechanical parametric amplifier 100 described with respect to FIG. 1A.

A portion of the flexible conductor 340 of the nanoscale electromechanical parametric amplifier 300 that is not coupled to the metal contact layer 330 is suspended over a region of the substrate 310 that is bare or is not covered with another material. In some embodiments, a length of the flexible conductor 340 is substantially parallel to a surface of the substrate 310 when the flexible conductor 340 is at its equilibrium or resting position. In some embodiments, an end of the flexible conductor 340 suspended over a region of the substrate 310 that is bare may be about 1 nm to 1 mm, about 1 nm to 10 microns, about 1 micron to 100 microns, or about 1 micron to 1 mm from the metal counter electrode 360. In some embodiments, the flexible conductor 340 may be similar to or the same as the flexible conductor 103 described with respect to FIG. 1A.

In some embodiments, the substrate 310 comprises a doped semiconductor. For example, in some embodiments, the substrate 310 comprises doped silicon. In some embodiments, the substrate 310 serves as a pumping electrode, similar to the pumping electrode 106 described with respect to FIG. 1A.

In some embodiments, the insulating layers 320 and 350 may comprise an insulating oxide, such as silicon dioxide or aluminum oxide, for example. In some embodiments, the insulating layers 320 and 350 may be the same thickness. In some embodiments, the insulating layers 320 and 350 may each be about 25 nm to 5 microns thick.

In some embodiments, the metal contact layer 330 and the metal counter electrode layer 360 may each comprise the same metal. In some embodiments, the metal contact layer 330 and the metal counter electrode layer 360 may each comprise copper, aluminum, gold, silver, platinum, titanium, palladium, or chromium. In some embodiments, the metal contact layer 330 and the metal counter electrode layer 360 may each be about the same thickness. In some embodiments, the metal contact layer 330 and the metal counter electrode layer 360 may each be about 25 nm to 5 microns thick.

In some embodiments, the combined thicknesses of the insulating layer 320 and the metal contact layer 330, as well as the combined thicknesses of the insulating layer 350 and the metal counter electrode layer 360, may be about 50 nm to 10 microns thick. In some embodiments, the combined thicknesses of the insulating layer 320 and the metal contact layer 330, as well as the combined thicknesses of the insulating layer 350 and the metal counter electrode layer 360, may be about 0.1 to 10 times a length of the flexible conductor 340 when the flexible conductor 340 is not resonating or vibrating. In some embodiments, the length of the flexible conductor 340 may be taken as the length of the flexible conductor 340 that is suspended over the region of the substrate 310 that is bare or is not covered with another material.

In some embodiments, the nanoscale electromechanical parametric amplifier 300 operates in a similar manner as the nanoscale electromechanical parametric amplifier 100 described with respect to FIG. 1A.

Figure 4:
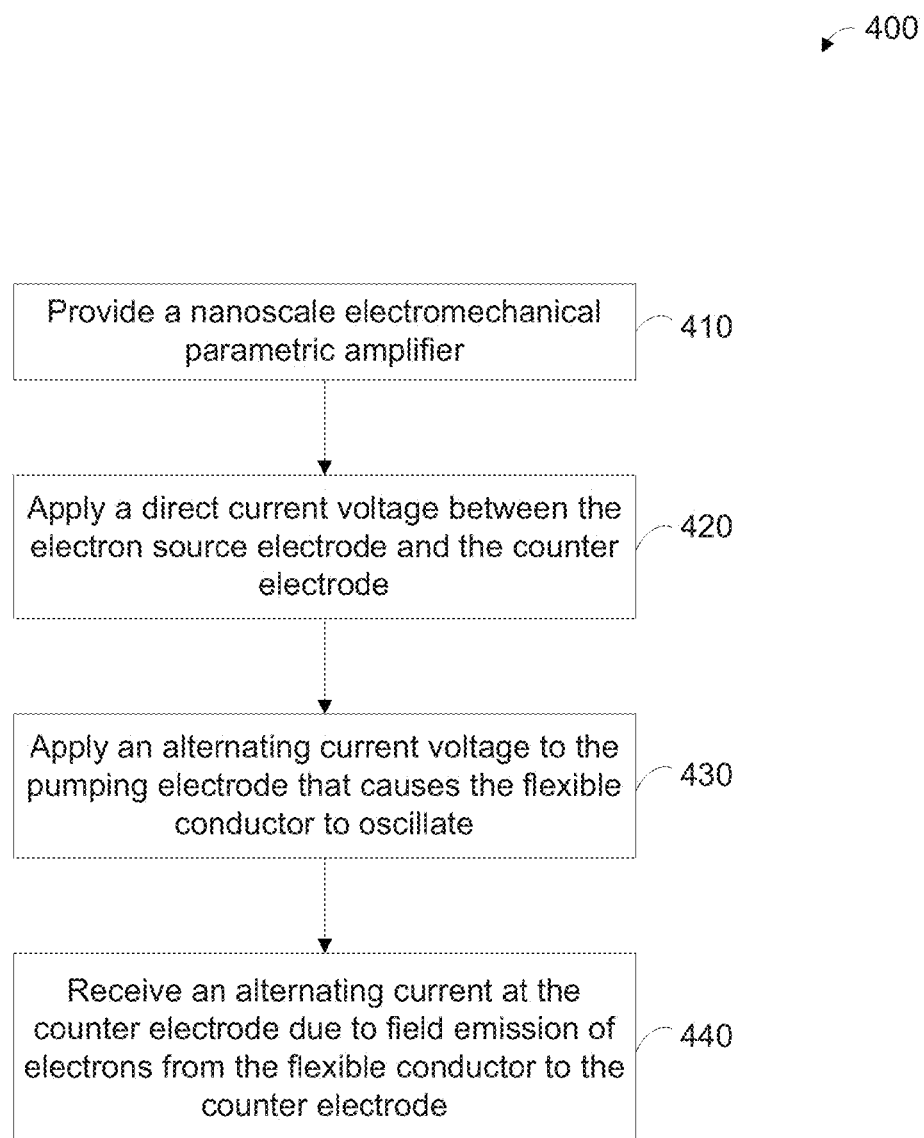
FIG. 4 shows an example of a flow diagram illustrating a method of operation of a nanoscale electromechanical parametric amplifier.

FIG. 4 shows an example of a flow diagram illustrating a method of operation of a nanoscale electromechanical parametric amplifier. Starting at operation 410 of a method 400 shown in FIG. 4, a nanoscale electromechanical parametric amplifier is provided. In some embodiments, the nanoscale electromechanical parametric amplifier may be the nanoscale electromechanical parametric amplifier 100 as shown in FIG. 1A, the nanoscale electromechanical parametric amplifier 200 as shown in FIG. 1B, or the nanoscale electromechanical parametric amplifier 300 as shown in FIG. 3. In some embodiments, the nanoscale electromechanical parametric amplifier includes an electron source electrode including a conductive base and a flexible conductor, a counter electrode, and a pumping electrode. The flexible conductor may have a first end and a second end, with the second end of the flexible conductor being coupled to the conductive base. A cross-sectional dimension (e.g., such as a diameter, etc.) of the flexible conductor may be less than about 100 nanometers. The counter electrode may be disposed proximate the first end of the flexible conductor and spaced a first distance from the first end of the flexible conductor. The pumping electrode may be disposed proximate the length of the flexible conductor and spaced a second distance from the flexible conductor.

In operation 420, a direct current voltage is applied between the electron source electrode and the counter electrode. In some embodiments, the direct current voltage may be about 1 volt to 200 volts. The direct current voltage applied between the electron source electrode and the counter electrode in part determines the gain of the nanoscale electromechanical parametric amplifier.

In operation 430, an alternating current voltage is applied to the pumping electrode. The alternating current voltage causes the flexible conductor to oscillate. In some embodiments, the alternating current voltage is about 0.01 volts to 10 volts and has a frequency of about 2 times the resonance frequency of the flexible conductor divided by an integer n (e.g., the integer being 1, 2, 3, 4, etc., with the formula being 2×resonance frequency/n).

In operation 440, an alternating current is received at the counter electrode due to field emission of electrons from the flexible conductor to the counter electrode. In some embodiments, the frequency of the alternating current depends in part on the resonance frequency of the flexible conductor and the orientation of the counter electrode. In some embodiments, the alternating current at the counter electrode has a frequency of about the resonance frequency of the flexible conductor or about two times the resonance frequency of the flexible conductor. In some embodiments, the alternating current may be about 1 nanoamp to 100 milliamps amps. In some embodiments, the alternating current voltage applied to the pumping electrode is amplified.

In some embodiments, the method 400 may further comprise applying a direct current offset voltage between the electron source electrode and the pumping electrode. In some embodiments, the direct current offset voltage may be about 0 volts to 200 volts. In some embodiments, the direct current offset voltage may serve to tune the gain, the bandwidth, and/or the resonance frequency of the nanoscale electromechanical parametric amplifier.

Applications

A resonant circuit NEMS device can amplify or detect the Fourier components of any signal that are both centered within the bandwidth ($\Delta\omega_0=\omega_0/Q$) of the flexible conductor's natural vibrational resonance frequency and capable of exciting the flexible conductor's vibrational modes into resonance. In this way, the device can function as a tunable band pass filter while simultaneously serving as an amplifier and a detector.

The bandwidth of the filtering process will be on the order of 100 kHz for a 100 MHz flexible conductor resonator. While operating in an amplification or detection mode, the gain/sensitivity is controlled by $V_p$, $V_0$, and $\phi$, where $\phi$ is the phase in the parametric amplifier. The resonance frequency, through its dependence on the spring constant k, can be tuned by adjusting $V_0$. Note that this capacitive frequency tunability is in addition to the electrostatic tensioning of the flexible conductor with a voltage. Chip-based devices can be readily fabricated and engineered to operate in the 100 kHz-1 GHz frequency band.

In some embodiments, a NEMS parametric amplifier can be used to amplify AC current and voltage signals in an appropriate band. For example, applying an AC voltage to the pumping electrode or to the flexible conductor at $\omega_0$ will drive the flexible conductor into resonance (with an amplified response), resulting in an AC current through the electron source electrode-counter electrode circuit path. Similarly, a current driven through the flexible conductor at $\omega_0$ will modulate the static charge on the flexible conductor and, because of $V_0$, excite oscillations which are in turn amplified by the parametric pump.

It is to be appreciated that the device will operate at a frequency which is inherent to the natural frequency of the flexible conductor (e.g., a carbon nanotube) used for the device. The natural frequency can thus be selected by employing longer or shorter length flexible conductors. It is also to be appreciated that by changing the bias voltage one can change the deflection of the flexible conductor; the higher the voltage, the greater the changes in deflection. Thus, in embodiments in which the device is used as an amplifier, the greater the degree of deflection of the flexible conductor, the stronger the electronic signal out will be (i.e., the field emissions) that is detected by the counter electrode.

Detection of RF electromagnetic radiation by a suspended, field-emitting carbon nanotube has been reported in previous work. Signal transduction occurs because the RF wave drives the nanotube into oscillation resulting, once again, in a current signal at the output of the device. The parametrically modulated systems, as disclosed herein, add improvements to the nanotube radio because the sensitivity to incoming RF photons can be enhanced by several orders of magnitude, possibly by as much as a factor of $10^5$ to $10^8$. Furthermore, a high-frequency device operated in the limit of high gain, in order to induce parametric self-oscillations, could be used to generate detectable RF dipole radiation. The device operated in the same high-gain, self-oscillation limit can also be used for time-keeping application; for example, the device could function as a clock for digital microelectronics with frequencies as high as a few Gigahertz.

Thermo-mechanical vibrations can also be amplified with the devices as disclosed herein. This amplification can be especially useful at low temperatures where the classical thermal vibration amplitude can be quite small. The tunneling current read-out scheme can also be tuned to reduce the back-action. Thus, by parametrically amplifying the thermal noise, the device functions as a thermometer to temperatures as low as about 100 nanoKelvin (nK) to 1 microKelvin ($\mu$K). The useful range of a carbon nanotube parametric amplifier thermometer, for example, may be about 100 nk to 500 Kelvin (K), or the melting point of the metallic contacts used in the device for the upper temperature limit.

CONCLUSION

Described herein are embodiments of a nanoscale electromechanical parametric amplifier that can act as a phase-sensitive, variable-gain filtering amplifier of electronic signals and, at the same time, can operate as a variable-sensitivity detector/transducer of RF electromagnetic waves. The amplifier can exhibit infinite gain at pumping voltages much less than 10 Volts. Additionally, the amplifier's overhead power consumption may be about 10 nanowatts (nW) to 1000 nW, making it a low-power amplifier. Gain limitations of the described amplifier will be governed by non-linear effects and the maximum achievable amplitude of the resonator (i.e., the flexible conductor or nanostructure). Also, the operational range for incoming signals will be limited by the current capacity of the flexible conductor, which is typically about 10 microamps ($\mu$A) to 100 $\mu$A. It is expected that this tunable nanoscale electromechanical parametric amplifier will find many useful applications in electronics (e.g., as a filter and an amplifier), in wireless communications (e.g., as a low-power RF receiver and transmitter), and in fundamental science (e.g., as a versatile NEMS device for studies in condensed matter and as a highly-sensitive RF photon detector in optics).

Further detail regarding the embodiments described herein can be found in the publication Aleman, B. J., Sussman, A., Mickelson, W., Zettl, A. "A Carbon Nanotube-based NEMS Parametric Amplifier for Enhanced Radio Wave Detection and Electronic Signal Amplification," Journal of Physics, Conference Series 302 (2011), which is herein incorporated by reference.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

We claim:

1. A device comprising:
    an electron source electrode including a conductive base and a flexible conductor, the flexible conductor having a first end and a second end, the second end of the flexible conductor being coupled to the conductive base, the flexible conductor having a cross-section, a dimension of the cross-section being less than about 100 nanometers;
    a counter electrode disposed proximate the first end of the flexible conductor and spaced a first distance from the first end of the flexible conductor; and
    a pumping electrode disposed proximate a length of the flexible conductor and spaced a second distance from the flexible conductor, the second distance being about 0.1 to 10 times a length of the flexible conductor.

2. A device comprising:
    an electron source electrode including a conductive base and a flexible conductor, the flexible conductor having a first end and a second end, the second end of the flexible conductor being coupled to the conductive base, the flexible conductor having a cross-section, a dimension of the cross-section being less than about 100 nanometers;
    a counter electrode disposed proximate the first end of the flexible conductor and spaced a first distance from the first end of the flexible conductor;
    a pumping electrode disposed proximate a length of the flexible conductor and spaced a second distance from the flexible conductor;
    an AC power supply; and
    a DC power supply, the AC power supply and the DC power supply being electrically connected in series to the pumping electrode.

3. The device of claim 2, wherein the DC power supply comprises a battery.

4. The device of claim 2, wherein the second distance is specified so that the flexible conductor is not in contact with the pumping electrode when vibration of the flexible conductor is at a maximum vibrational amplitude.

5. The device of claim 2, wherein the flexible conductor is selected from a group consisting of a single-wall nanotube, a multi-wall nanotube, and a nanowire.

6. The device of claim 2, wherein the flexible conductor is selected from a group consisting of a single-wall carbon nanotube, a multi-wall carbon nanotube, a single-wall boron-carbon-nitrogen nanotube, and a multi-wall boron-carbon-nitrogen nanotube.

7. The device of claim 2, wherein the flexible conductor comprises a semiconducting nanowire or a metal nanowire.

8. The device of claim 2, wherein the conductive base comprises a metal selected from a group consisting of copper, aluminum, gold, silver, platinum, titanium, palladium, and chromium.

9. The device of claim 2, wherein the pumping electrode comprises a metal or a doped semiconductor.

10. The device of claim 2, wherein the flexible conductor has a length of about 0.5 microns to 10 microns.

11. The device of claim 2, wherein the dimension of the cross-section of the flexible conductor is about 2 nanometers to 50 nanometers.

12. The device of claim 2, wherein the first distance is about 1 nanometer to 1 millimeter.

13. The device of claim 2, wherein the second distance is about 0.1 to 10 times a length of the flexible conductor.

14. The device of claim 2, wherein the electron source electrode and the counter electrode are disposed in a first plane.

15. The device of claim 2, wherein the device is operable to have a DC voltage applied between the electron source electrode and the counter electrode, to have a DC offset voltage provided by the DC power supply applied between the electron source electrode and the pumping electrode, to have an AC voltage provided by the AC power supply applied to the pumping electrode that causes the flexible conductor to oscillate, and to receive an alternating current at the counter electrode due to field emission of electrons from the flexible conductor to the counter electrode.

16. The device of claim 15, wherein the alternating current received at the counter electrode is an amplification of the AC voltage applied to the pumping electrode.

17. A method comprising:
(a) providing a device comprising:
an electron source electrode including a conductive base and a flexible conductor, the flexible conductor having a first end and a second end, the second end of the flexible conductor being coupled to the conductive base, the flexible conductor having a cross-section, a dimension of the cross-section being less than about 100 nanometers;
a counter electrode disposed proximate the first end of the flexible conductor and spaced a first distance from the first end of the flexible conductor; and
a pumping electrode disposed proximate a length of the flexible conductor and spaced a second distance from the flexible conductor;
(b) applying a DC voltage between the electron source electrode and the counter electrode;
(c) applying an AC voltage to the pumping electrode that causes the flexible conductor to oscillate; and
(d) receiving an alternating current at the counter electrode, the alternating current due to field emission of electrons from the flexible conductor to the counter electrode caused by the DC voltage between the electron source electrode and the counter electrode.

18. The method of claim 17, further comprising:
applying a DC offset voltage between the electron source electrode and the pumping electrode.

19. The method of claim 17, wherein the alternating current received at the counter electrode is an amplification of the AC voltage applied to the pumping electrode.

* * * * *